United States Patent [19]

Taniguti

[11] Patent Number: 4,556,946
[45] Date of Patent: * Dec. 3, 1985

[54] GROUND DETECTION ARRANGEMENT FOR A.C. GENERATOR

[75] Inventor: Ryosuki Taniguti, Nagasaki, Japan

[73] Assignee: Mitsubishi Denki Kabushiki Kaisha, Tokyo, Japan

[*] Notice: The portion of the term of this patent subsequent to Sep. 17, 2002 has been disclaimed.

[21] Appl. No.: 402,972

[22] Filed: Jul. 29, 1982

[30] Foreign Application Priority Data

Aug. 7, 1981 [JP] Japan .................................. 56-124881

[51] Int. Cl.$^4$ ........................ G06G 7/62; G08B 21/00
[52] U.S. Cl. .................................... 364/481; 324/51; 340/648; 340/650; 361/50; 364/550
[58] Field of Search ............... 364/481, 483, 492, 550, 364/551, 734; 324/51, 52, 158 MG; 340/292, 648, 650, 660, 664, 659; 318/142, 144; 322/99; 361/42, 50

[56] References Cited

U.S. PATENT DOCUMENTS

| 3,303,410 | 2/1967 | Hoover et al. | 322/99 |
| 3,746,979 | 7/1973 | Kildishev et al. | 322/99 |
| 4,000,464 | 12/1976 | Nüssel | 361/42 |
| 4,138,706 | 2/1979 | Johnson et al. | 361/42 |
| 4,187,525 | 2/1980 | Nagura et al. | 364/482 X |
| 4,214,311 | 7/1980 | Nakashima et al. | 364/482 |

Primary Examiner—Errol A. Krass
Assistant Examiner—Kevin J. Teska
Attorney, Agent, or Firm—Leydig, Voit & Mayer

[57] ABSTRACT

The present invention relates to a ground detection arrangement for an A.C. generator in which positive and negative D.C. voltage are alternately applied to the neutral point of an armature winding so as to detect voltages proportional to ground currents corresponding to the respective D.C. voltages, and a ground resistance is obtained with the sum of the absolute values of both the detected voltages, whereby the existence of grounding can be correctly detected regardless of the grounding position.

9 Claims, 3 Drawing Figures

GROUND DETECTION ARRANGEMENT FOR A.C. GENERATOR

BACKGROUND OF THE INVENTION

This invention relates to a ground detection arrangement for an A.C. generator.

FIG. 1 illustrates an example of a conventional arrangement of the type of the present invention. In the figure, numeral 1 denotes a brushless A.C. generator, numeral 2 an armature winding, numeral 3 a three-phase fullwave rectifier, numeral 4 a field winding, and numeral 5 an insulation resistance detector. The insulation resistance detector 5 includes both D.C. voltage source 8 and current relay 9 for the direct current introduced across a brush 6 and a slip ring 7 into between the neutral point C of armature winding 2 and the ground A. If the ground resistance (insulation resistance) $R_S$ is reduced to cause a current exceeding the critical value of reference, the current relay 9 is actuated. Numeral 10 denotes a protection resistor.

In such a conventional device, however, the current value $I_{SP}$ in the case of the grounding occurring on the side of the positive pole of field winding 4 and the current value $I_{SN}$ in the case of the grounding occurring on the side of the negative pole N are different from each other as follows:

$$I_{SP} = \frac{E - \frac{1}{2}E_f}{R_1 + R_S} \quad (1)$$

$$I_{SN} = \frac{E + \frac{1}{2}E_f}{R_1 + R_S} \quad (2)$$

where:

$E_f$: Voltage of field winding $R_1$: Resistance value of protection resistor Therefore, conventional devices do not allow for correct detection of the existence of grounding in the field winding 4.

SUMMARY OF THE INVENTION

This invention has been introduced in order to eliminate the disadvantage described above, and has for its object to provide a ground detection arrangement for an A.C. generator in which positive and negative D.C. voltages are alternately applied to the neutral point of an armature winding so as to detect voltages proportional to ground currents corresponding to the respective D.C. voltages, and ground resistance is obtained with the sum of the absolute values of both the detected voltages, whereby the existence of grounding can be correctly detected regardless of the grounding position.

BRIEF DESCRIPTION OF THE DRAWINGS

In the drawings, the same symbols indicate the same or corresponding parts.

DESCRIPTION OF THE PREFERRED EMBODIMENT

Figure 1:
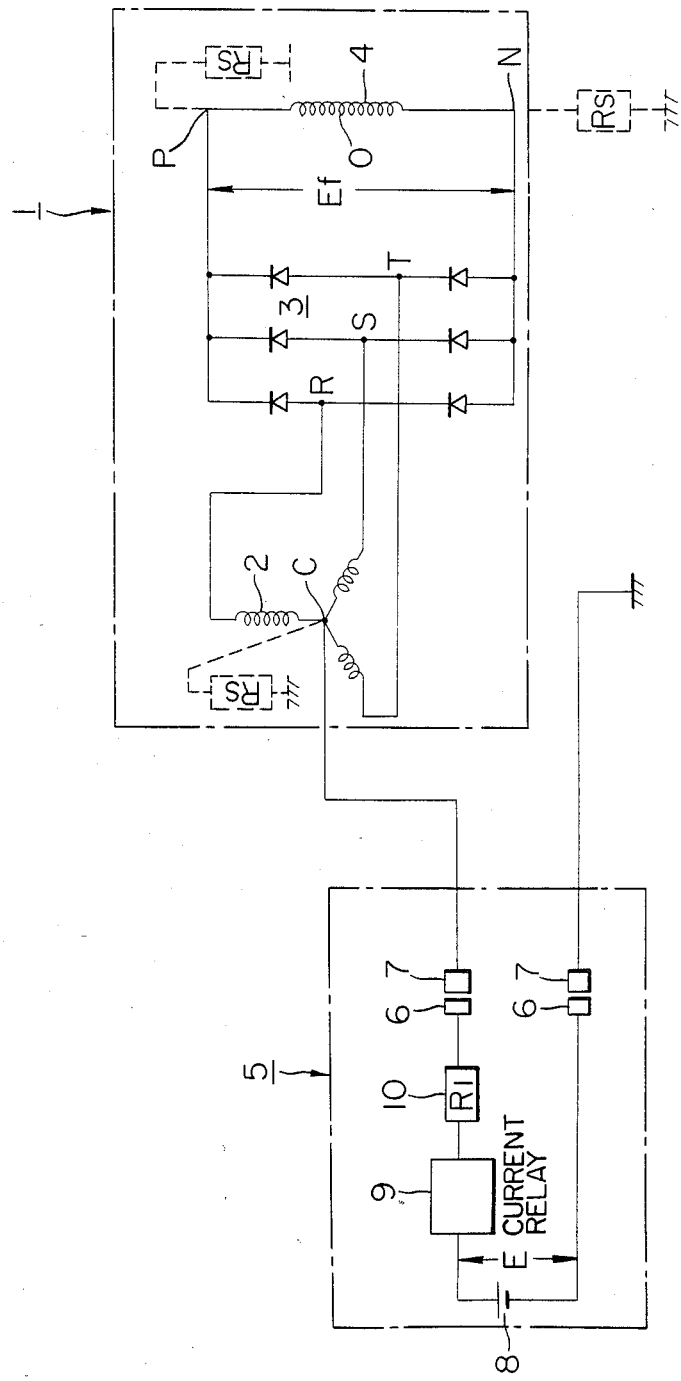
FIG. 1 is a circuit diagram of a ground detection arrangement for an A.C. generator in a prior art.
Figure 2:
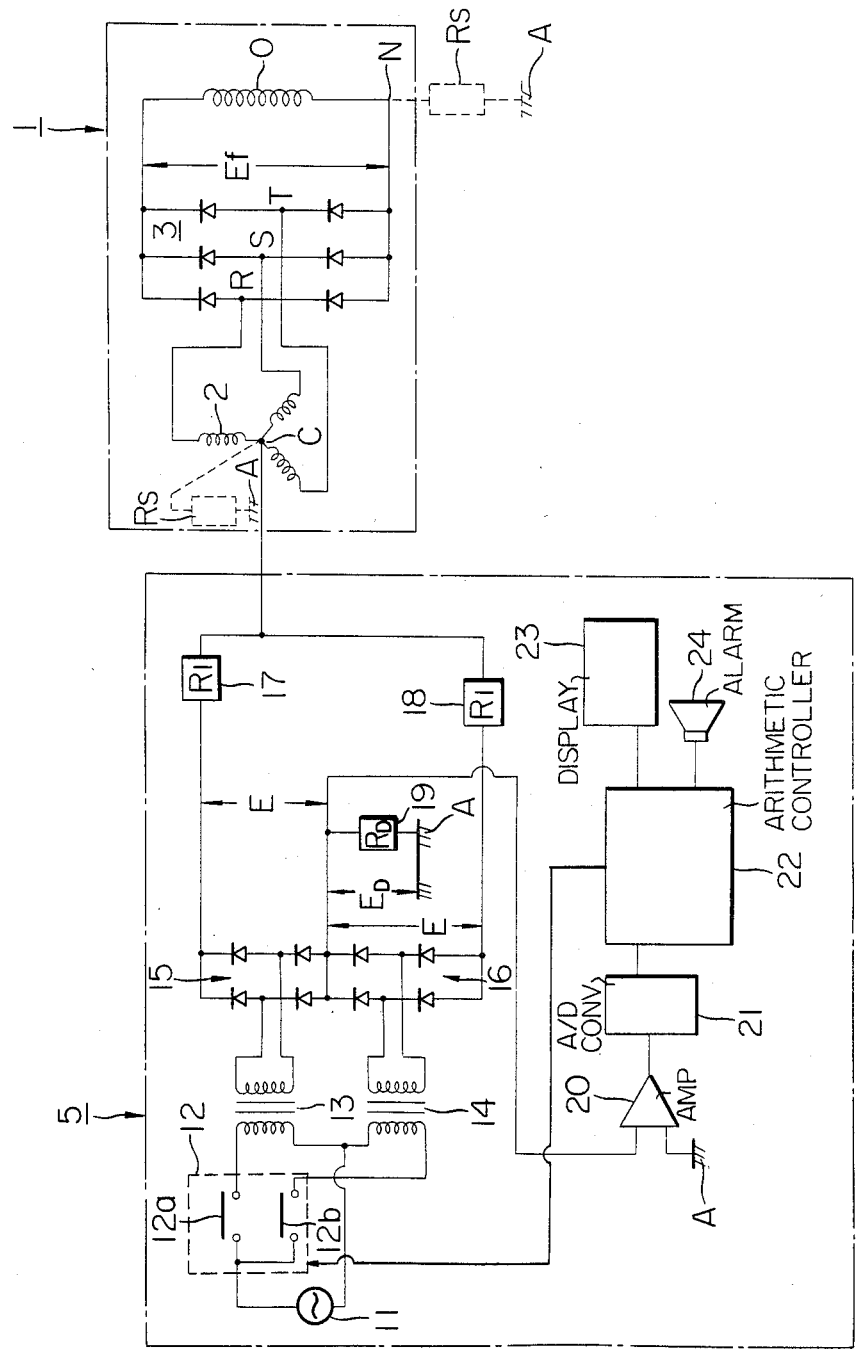
FIG. 2 is a circuit diagram of a ground detection arrangement for an A.C. generator according to the present invention.

In FIG. 2, an A.C. source 11 is connected switchably to transformers 13 and 14 through the contacts 12a and 12b of a change-over switch 12. The output of the secondary winding of the transformer 13 is applied to a rectifier 15, while the output of the secondary winding of the transformer 14 is applied to a rectifier 16. The above change-over switch 12 comprises a suitable relay which has mechanical switching contacts or may comprise a semiconductor switch such as a thyristor or transistor apparatus. The D.C. output of the rectifier 15 (voltage E) is impressed upon the neutral point C of an armature winding 2 through a protection resistor 17, while the D.C. output of the rectifier 16 (voltage E) is applied to the neutral point C of the armature winding 2 through a protection resistor 18. The rectifiers 15 and 16 are connected in parallel. A detection resistor 19 (of lower resistance value $R_D$) is inserted between the connection point of the rectifiers 15, 16 and the ground A, and the potential of the connection point is supplied to an A/D converter 21 through a voltage amplifier 20 and is digitized to be supplied to an arithmetic controller 22. The arithmetic controller 22 executes the below-described calculation to supply a display device 23 with the calculated results and transmit an alarm signal to an alarm device 24 and moreover generate a switching signal 22a and 22b for switching the contacts 12a, 12b of the change-over switch 12 at regular time intervals.

According to the above arrangement, D.C. voltages $+E$ and $-E$ are applied alternately to the neutral point C of the armature winding 2 for a constant period respectively through protection resistances 17 and 18 of high resistance value $R_1$. In a case where the magnetizing circuit is functioning properly, the current does not flow through the detection resistor 19 because of very high resistance $R_S$ to the ground. For example, however, if the neutral point C is grounded, current of a level similar to that of the current at the ground point also flows across the detection resistor 19. The detected voltages $E_D$ at this time are respectively as indicated by the following equations 3 and 4 at the application of the D.C. voltage $+E$ and at the application of the D.C. voltage $-E$, and they are equal in the absolute value. The same applies to points R, S, T and the middle point O of the field winding 4 in the figure. When $E_{D+}$ and $E_{D-}$ denote respectively detected voltages developing across the detection resistor 19 at the times of applying the D.C. voltages $+E$ and $-E$, then $$E_{D+} = \frac{-E}{R_0} R_D \quad (3)$$

$$E_{D-} = \frac{+E}{R_0} R_D \quad (4)$$

where $$R_0 = R_1 + 2(R_D + R_S)$$

However, in case of the field winding 4 being grounded and the ground point being the middle point O, the situation is the same as in the case of the neutral point being grounded. In case of any point other than the neutral point, e.g., the positive pole P, being grounded and if $E > E_f$, then $$E_{D+} = -\frac{E + E_f}{R_0} \quad (5)$$

$$E_{D-} = \frac{E - E_f}{R_0} \quad (6)$$

On the other hand, in case of the negative pole N being grounded, $E_{D+}$ and $E_{D-}$ have different values as follows:

$$E_{D+} = -\frac{E - E_f}{R_0} \quad (7)$$

$$E_{D-} = \frac{E + E_f}{R_0} \quad (8)$$

Therefore, if the ground points are C, R, S, T and O, the sum of $E_{D+}$ and $E_{D-}$ is zero, whereas when the ground point lies from the middle point O of the field winding 4 toward positive pole P or toward negative pole N, the sum of $E_{D+}$ and $E_{D-}$ is negative or positive respectively. Accordingly the ground position at the grounding of the field winding can be judged by calculating the sum:

$$E_{D+} + E_{D-} \quad (9)$$

That is, the ground position can be estimated based on the following calculations:

$$E_{D+} + E_{D-} = 0 \quad (1)$$

The grounding is at either of C or R or S or T, or at the middle point O of the field winding 4.

$$E_{D+} + E_{D-} > 0 \quad (2)$$

The grounding is at the negative pole N side from the middle point O of the field winding 4.

$$E_{D+} + E_{D-} < 0 \quad (3)$$

The grounding is at the positive pole P side from the middle point O of the field winding 4.

In addition, the value of the ground resistance $R_S$ can be obtained by calculating the following equation (10):

$$R_S = \left( \frac{E}{|E_{D+}| + |E_{D-}|} - 1 \right) \cdot R_D - \frac{R_1}{2} \quad (10)$$

Though the detected voltages $E_{D+}$ and $E_{D-}$ are influenced by the magnetization voltage $E+$ as described above, the sum of the their absolute values $|E_{D+}|$, $|E_{D-}|$ are free from the influence of magnetization voltage $E_f$. Therefore the correct value of the ground resistance $R_S$ can be determined independently of the ground position of the field winding.

The arithmetic controller 22 calculates the sum of $E_{D+} + E_{D-}$ and Equation (10) to transmit the data of both the ground resistance $R_S$ and the ground position to the display device 23. Besides, when the value of the ground resistance $R_S$ becomes less than the reference value, the alarm signal is transmitted to the alarm device 24.

In the case where the values of $E_{D+}$ and $E_{D-}$ are zero or approximately zero, such a calculation should not be executed.

As set forth above, according to this invention, into positive and negative D.C. voltages are alternately applied across the neutral point of an armature winding and ground, and after which ground currents are converted into and detected as voltages by a detection resistance, the ground resistance is calculated by the use of the detected voltages, and this ground resistance is compared with a reference value so as to detect the existence of grounding. Herein, in calculating the ground resistance, the sum of the absolute values of the detected voltages at the application of the positive D.C voltage and at the application of the negative D.C. voltage is employed, and hence, influences due to different different ground positions of the field winding can be eliminated to enhance the precision of calculation, so that the existence of the substantial grounding can be detected more accurately than in the prior art.

Figure 3:
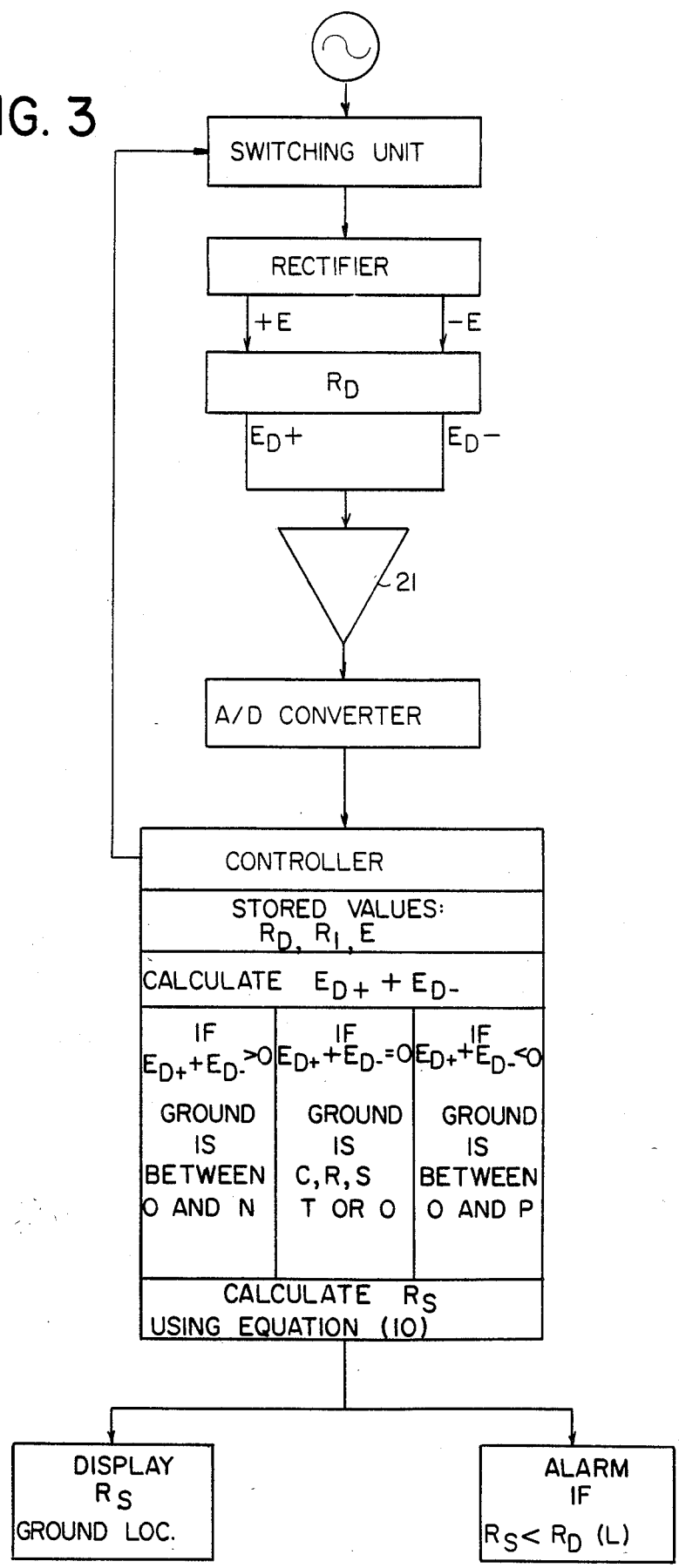
FIG. 3 is a flow diagram to explain the steps followed in determining the values of insulation resistance and location of grounds detected by the device of the invention.

In summary, referring to the flow diagram of FIG. 3, $E_{D+}$ and $E_{D-}$ are detected as the voltages across the resistor $R_D$ and are alternatively fed into the amplifier 20 which serves as a combiner at a frequency which is controlled by the controller. The combiner feeds the combined (mixed) voltages through and A/D converter to the controller. Values of $R_D$, $R_1$ and E are stored in the controller. The controller calculates the sum $E_{D+} + E_{D-}$ and $R_S$ (using equation 10) based on the calculated sum and the stored values $R_D$, $R_1$ and E. If the sum $E_{D+} + E_{D-}$ equals 0, the controller determines that the ground is at either points C or R or S or T or O. If the sum $E_{D+} + E_{D-}$ is greater than 0, the controller determines that the ground is in the section between 0 and N. If $E_{D+} + E_{D-}$ is less than 0, the controller determines that the ground is between O and P. The value of insulation resistance ($R_S$) and the position of grounding at either of those points or in those sections are then displayed and an alarm is actuated if $R_S$ is less than a predetermined reference value for that ground position.

What is claimed is:

1. A ground detection arrangement for an A.C. generator comprising:

resistors ($R_1$) of high resistance connected to a neutral point of an armature winding of the A.C. generator, a voltage source of positive and negative D.C. voltages ($+E$) and ($-E$) alternately applied to the neutral point of said armature winding through said resistors ($R_1$), a detecting resistor ($R_D$) connected between the D.C. voltage source and the ground of the circuit arrangement, and an arithmetic controller connected to receive voltages ($E_{D+}$) and ($E_{D-}$) developed across said detecting resistor ($R_D$) when the respective positive and negative D.C. voltages ($+E$) and ($-E$) are applied, including means for calculating a ground resistance ($R_S$) for a ground position on the basis of a sum of absolute values of both detected voltages ($E_{D+}$) and ($E_{D-}$), and said D.C. voltages ($+E$) and ($-E$) and said resistors ($R_1$) and ($R_D$) and for comparing the calculated result for ground resistance ($R_S$) with a reference resistance value.

2. A ground detection arrangement for an A.C. generator as defined in claim 1 wherein:

said arithmetic controller transmits an alarm signal when the ground resistance has become smaller than a predetermined reference value.

3. A ground detection arrangement for an A.C. generator as defined in claim 1 wherein:

said arithmetic controller further calculates detected voltage values appearing across said detecting resistor, each of said voltage values comprising a different polarity from said D.C. voltage source and includes means for providing an alarm signal as a function of the calculated results when said results are distinct from a predetermined reference value for that grounded position.

4. A ground detection arrangement for an A.C. generator as defined in claim 1 wherein:
said detection arrangement further includes a display device to display the value of the ground resistance at said ground position, which is calculated by said arithmetic controller.

5. A ground detection arrangement for an A.C. generator as defined in claim 1 wherein:
said D.C. voltage source is obtained alternately from first and second rectifiers connected in parallel to each other and respectively connected to the secondary sides of first and second transformers connected in parallel to each other and to an A. C. voltage source through a change-over switch.

6. A ground detection arrangement for an A.C. generator as defined in claim 5 wherein:
said detecting resistor is connected between ground and the output junction point of the first and second parallel connected rectifiers.

7. A ground detection arrangement for an A.C. generator as defined in claim 1 wherein;
said arithmetic controller transmits a signal for operating a change-over switch at predetermined time intervals.

8. A ground detection arrangement for an A.C. generator as defined in claim 1, the detected voltages developed across said detecting resistor being applied to said arithmetic controller through an amplifier and an analog-digital convertor.

9. A ground detection arrangement for an A.C. generator as defined in claim 1, wherein:
the armature winding and a field winding of said generator are connected to each other through rectifiers.

* * * * *